METHODS OF MANUFACTURING THIN FILM COMPONENTS
Original Filed Aug. 30, 1965 3 Sheets-Sheet 1
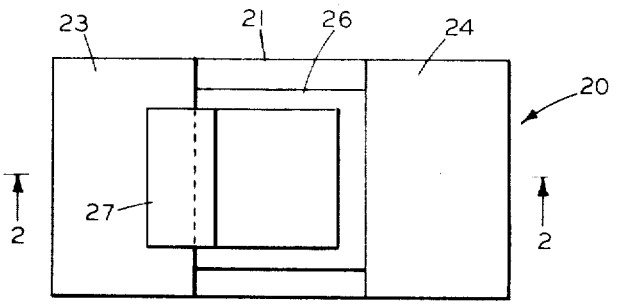
FIG.-1
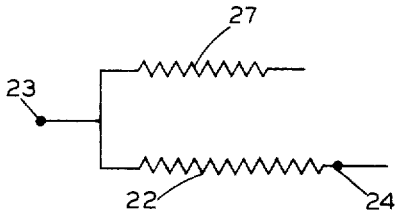
FIG.-3
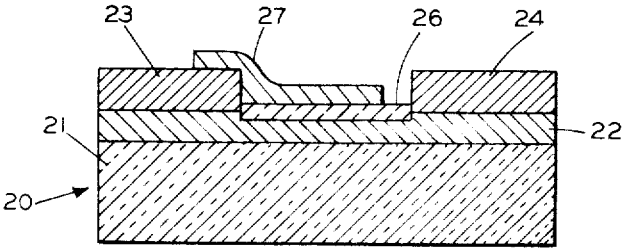
FIG.-2
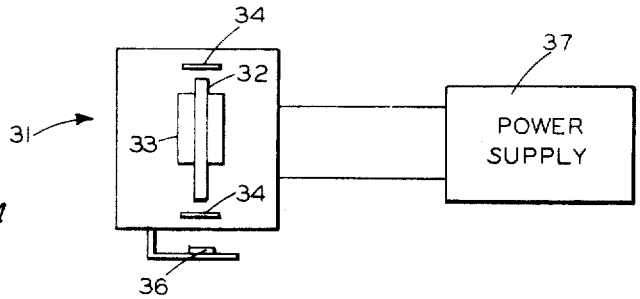
FIG.-4
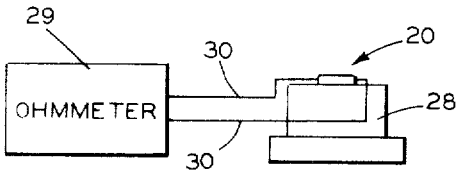
INVENTOR
A.M. HANFMANN
BY
ATTORNEY United States Patent Office Re. 27,766
Reissued Oct. 2, 1973

27,766

METHODS OF MANUFACTURING THIN FILM COMPONENTS

Alexander M. Hanfmann, Allentown, Pa., assignor to Western Electric Company, Incorporated, New York, N.Y.

Original No. 3,400,456, dated Sept. 10, 1968, Ser. No. 483,594, Aug. 30, 1965. Application for reissue Aug. 20, 1970, Ser. No. 65,548
Int. Cl. H01c *7/00, 17/00*
U.S. Cl. 29—620 10 Claims

Matter enclosed in heavy brackets [ ] appears in the original patent but forms no part of this reissue specification; matter printed in italics indicates the additions made by reissue.

ABSTRACT OF THE DISCLOSURE

[The resistance of] *"Open" holes and "shunt" holes are produced by a laser beam in* an electrical component comprising a substrate having coated thereon at least two conductive layers separated by a nonconductive layer. [is adjusted by applying a laser beam to the component.] *One example of the utility of such a technique is the adjustment of resistance of the electrical component.* If the resistance of the component is less than a desired value it is increased by forming open holes in one or both of the conductive layers with a high energy laser pulse of short duration which evaporates the layers through which it passes. If the resistance is greater than the desired value it is decreased by forming shunt holes between the conductive layers with a lower energy pulse of longer duration which partially evaporates and melts the layers through which it passes thus causing a connection between the conductive layers.

This invention relates to methods of manufacturing thin film components and, more particularly, to [methods of bilaterally] *placing holes in the components with energy beams to perform such functions as* adjusting thin film components[, such as resistors,] to desired values. Accordingly, the general objects of this invention are to provide new and improved methods of such character.

Heretofore, a thin film component, such as a resistor, has been manufactured by depositing a thin film of an anodizable metal, such as tantalum, on an insulative substrate, and then selectively removing portions of the film to form a resistor, the resistance of which approximated, but was less than, the desired final value thereof. The resistor was then adjusted to the desired value by subjecting it to an anodizing process which converted part of the metal film to an oxide thereof, thereby reducing the effective conductive cross-sectional area of the film and increasing the resistance of the resistor. Alternatively, the effective conductive cross-sectional area of the metal film has been reduced by aperturing of the film or by thermal oxidation thereof.

All of these methods have the common disadvantage of enabling only a unilateral adjustment of resistance, i.e., they enable only resistance increases to be effected. Accordingly, great care had to be exercised in carrying out the deposition and film removal steps to assure that the value of the resistor, after these steps, was less than the desired value thereof; since, if it was not, nothing could be done to decrease the value of the resistor and it had to be scrapped with a resultant economic loss. Additionally, in cases where a plurality of resistors were formed on a single substrate, if one of the resistors was higher than its desired value, the entire substrate had to be scrapped, even though the other resistors might have been within their desired values or susceptible of adjustment thereto.

The present invention overcomes these and other problems by providing a bilaterally adjustable thin film component which includes two layers of conductive materials separated by a layer of nonconductive material. In accordance with the invention, if an electrical parameter of such a component deviates in a first direction from a desired value thereof, an ["open hole"] *"open"* hole is formed in the component; if it deviates in an opposite direction from the desired value, a "shunt" hole is formed in the component.

As used herein, the term "open" hole is a hole whose inner wall has a composition which is essentially the same, point for point, as that as the material immediately surrounding the hole. Such a hole may be formed in only one of the conductive layers, or it may be a multilayer hole which extends from one conductive layer through the nonconductive layer to and through the other conductive layer. In either event, an open hole functions to reduce the effective conductive cross-sectional area of the conductive layer in which it is located but, if a multilayer open hole, does not effect any electrical connection between the two conductive layers. A "shunt" hole, on the other hand, is a multilayer hole, extending from one conductive layer to the other, which establishes an electrical connection between the two conductive layers. The inner wall of such a hole either is composed of the same material as that of one of the conductive layers or is composed partially of the material of one of the conductive layers and composed partially of the material of the other conductive layer. The composition of the inner wall may also be a mixture of material of both conductive layers and the nonconductive layer.

Advantageously, the holes are formed by high energy pulses, such as pulses of monochromatic, coherent light generated by a laser. A relatively high power density, short duration pulse, evaporates the layer or layers to which it is applied, thereby forming an open hole. A lower power density, longer duration pulse, partially evaporates and partially melts the layers to which it is applied, thereby forming a shunt hole.

In one embodiment of the invention, the component is a resistor having a pair of contacts connected to one of the conductive layers, with one of the contacts additionally being connected to the other conductive layer. A resistor thus formed may be thought of as two individual resistors having a common connection. An open hole in such a resistor reduces the effective conductive cross-sectional area of one or both of the conductive layers and thereby increases the resistance between the contacts. A shunt hole in the resistor, on the other hand, establishes a shunt connection between the conductive layers, thereby connecting electrically a portion of one conductive layer in parallel with a portion of the other and decreasing the resistance between the contacts.

The invention, as well as its objects, advantages and features, will be more fully understood from the following detailed description of specific embodiments thereof, when considered in conjunction with the appended drawings, wherein:

FIG. 1 is a plan view of a resistor[,] embodying certain principles of the invention;

FIG. 2 is a cross-sectional view taken along the line 2—2 of FIG. 1;

FIG. 3 is an electrical representation of the resistor illustrated in FIGS. 1 and 2;

FIG. 4 is a schematic representation of apparatus for carrying out a bilateral resistance adjustment in accordance with the invention;

Figure 7:
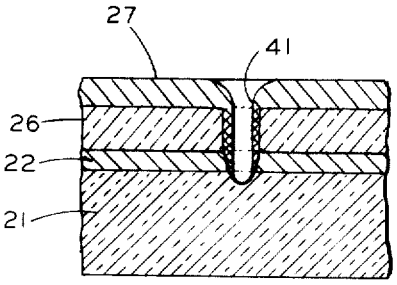
Figure 8:
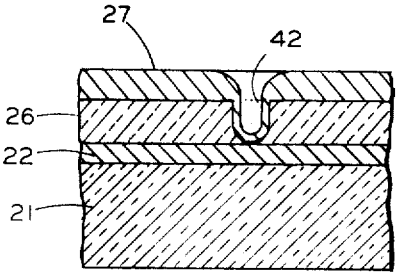
Figure 10:
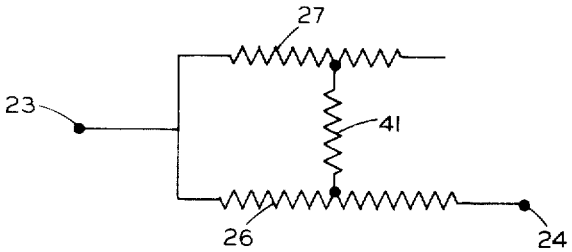
Figure 9:
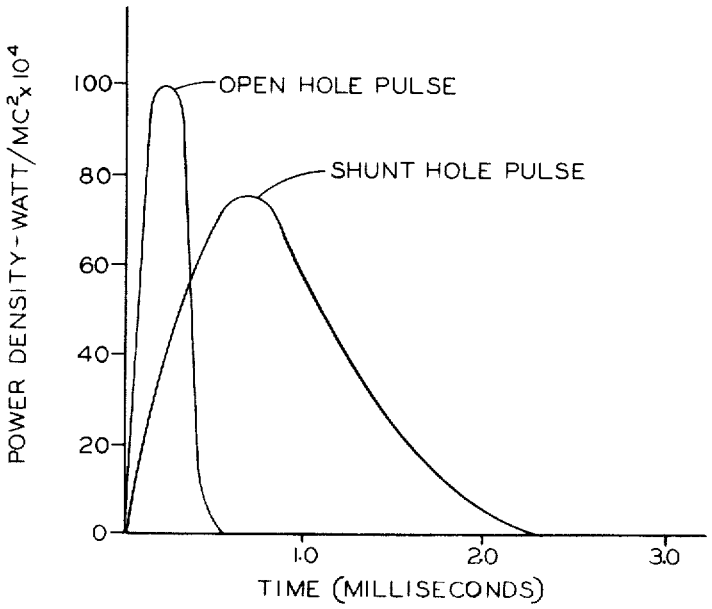
Figure 11:
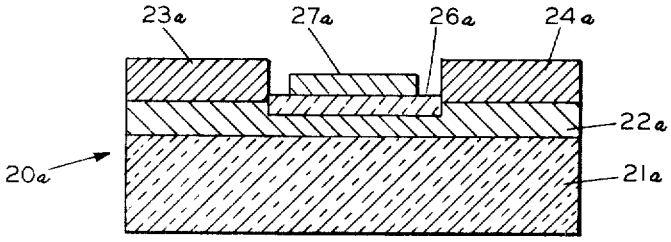
Figure 12:
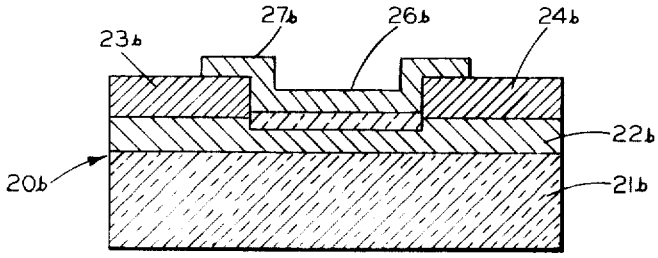

FIG. 7[,] is an elevational, cross-sectional view, with portions broken away for the sake of clarity, of the resistor of FIGS. 1 and 2 after formation of a first type of shunt hole therein;

FIG. 8 is a similar view of the resistor after formation of a second type of shunt hole therein;

FIG. 9 is a graph illustrating the respective wave shapes of light pulses employed to form open and shunt holes;

FIG. 10 is an electrical representation of the resistor of FIGS. 1 and 2 after formation of a shunt hole therein; and FIGS. 11 and 12 are elevational, cross-sectional views of alternative embodiments of bilaterally adjustable thin film resistors.

*Illustratively, the invention is described in connection with adjusting values of resistors. However, it is to be understood that some aspects of the invention, such as the inventive method of shunt hole production, have many other useful applications.*

It is to be understood that the elevational views of the drawings are greatly enlarged and distorted for the sake of clarity of illustration.

Referring now to the drawings, FIGS. 1 and 2 depict a thin film resistor 20 which includes an insulative substrate 21; a first thin film 22 of conductive material in adhering contact with the substrate; a pair of conductive contacts 23 and 24 attached respectively to opposite ends of the thin film 22; a layer 26 of nonconductive material in adhering contact with the portion of the thin film 22 extending between the contacts 23 and 24; and a second thin film 27 of conductive material in adhering contact with a portion of the contact 23 and with most of the nonconductive layer 26. Leads (not shown) may be attached to the contacts 23 and 24.

The materials from which the resistor 20 is constructed are selected in accordance with desired physical, chemical and electrical characteristics of the resistor, and metallurgical compatibility of the materials. Similarly, the technique employed to fabricate the resistor 20 is chosen, considering the composition of the several materials, the desired cost and quality of the resistor, etc., in accordance with sound manufacturing engineering principles. As an example, the following materials and method of manufacture may be used to fabricate a typical resistor 20.

EXAMPLE

The insulative substrate 21 may be composed of sapphire. The first thin film 22 may be composed of tantalum and may be deposited on the substrate by a generally conventional sputtering process. The contacts 23 and 24 may each be comprised of successive layers of "Nichrome" (an alloy consisting essentially of 80% nickel and 20% chromium) and gold, and may be deposited on the thin film 22 by successive evaporations through a mask. The nonconductive layer 26 may be formed by anodizing the tantalum thin film 22 to convert a portion thereof to tantalum pentoxide ($Ta_2O_5$). (Anodization of the film 22 also decreases the thickness of the portion thereof extending between the contacts 23 and 24.) The second thin film 27 may be composed of "Nichrome" and may be deposited onto portions of the contact 23 and the nonconductive layer 26 by an evaporation process similar to that employed to deposit the contacts 23 and 24.

The resistor 20 may have the following dimensions:

| | Length (inches) | Width (inches) | Thickness |
|---|---|---|---|
| Substrate 21 | .320 | .160 | .048 inch. |
| First thin film 22 | .320 | .120 | 1,700 angstroms. |
| Contacts 23 and 24 | .100 | .160 | NiCr 200 angstroms. Au 3,500 angstroms. |
| Nonconductive layer 26 | .120 | .120 | 300-500 angstroms. |
| Portion of thin film 22 underlying layer 26. | .120 | .120 | 1,500-1,600 angstroms. |
| Second thin film 27 | .140 | .080 | 300 angstroms. |

Electrically, as seen in FIG. 3, the resistor 20 can be represented as two individual resistors 22 and 27 having a common connection at the contact 23. For the materials and dimensions set forth above, the resistors 22 and 27 may typically have values of 250 ohms and 50 ohms, respectively. Prior to any resistance adjustment, the resistance value of the resistor 20, as measured between the contacts 23 and 24, is the resistance value of the resistor 22.

RESISTOR ADJUSTMENT

To adjust the resistance value of the resistor 20, apparatus of the type shown in FIG. 4 may be employed. The apparatus includes a suitable holder 28 for the resistor 20, an ohmmeter 29 having a pair of test leads 30—30 and a conventional laser assembly 31.

As is conventional, the laser assembly 31 includes a laser rod 32, a flash lamp 33, a pair of mirrors 34—34, a focusing lens 36 and a power supply 37. To operate the laser assembly 31, a pulse of electrical power from the power supply 37 is transmitted to the flash lamp 33, causing the lamp to flash and irradiate the laser rod 32 with light. Irradiation of the rod 32 causes the laser rod to emit monochromatic, coherent light rays which are caused to reverberate back and forth through the rod by the mirrors 34—34, causing further light emission. A portion of the emitted light is allowed to escape through the lower mirror 34, whereupon it is focused by the lens 36 to a desired beam width. The energy level of the emitted light and its duration are controlled by controlling the energy level and duration of the electrical pulse transmitted from the power supply 37 to the flash lamp 33. For a more detailed explanation of laser action and construction see: Young, D. S., "The Laser as an Industrial Tool," The Western Electrical Engineer (October 1964), p. 2.

Figure 5:
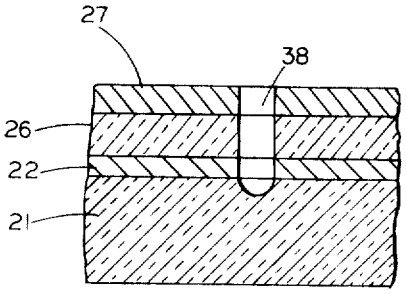
FIG. 5 is an elevational, cross-sectional view, with portions broken away for the sake of clarity, of the resistor of FIGS. 1 and 2 after formation of a first type of open hole therein.

In carrying out a resistance adjustment, the resistor 20 is placed on the holder 28 and secured thereto. The ohmmeter leads 30—30 are then connected to the contacts 23 and 24 (or to leads attached thereto), and the resistance value of the resistor 20 is measured. If the measured resistance value is less than that desired, the laser assembly 31 is energized to apply a high energy light pulse to the thin film 27. The energy level (i.e., power density) and duration of the pulse is such as to evaporate the portions of the film 27, the nonconductive layer 26 and the film 22, encompassed by the pulse (i.e., the light beam). The pulse may also evaporate a portion of the substrate 21. As seen in FIG. 5, this results in the formation of an open hole 38 whose inner wall composition is essentially the same point for point, as the material immediately surrounding the hole. The diameter of the hole 38 is essentially the same as that of the beam width of the forming pulse, which may be 5 mils. The hole 38 reduces the effective width of the films 22 and 27, thereby reducing the effective conductive cross-sectional areas of the films and increasing the resistance thereof. The increase in resistance of the film 22 increases the resistance of the resistor 20, while the increase in resistance of the film 27 has no effect thereon, at this time. Typically, an open hole for this embodiment may increase the resistance of the resistor by 0.5% i.e., approximately 0.13 ohm.

For the materials and dimensions set forth in the example above, a typical pulse for forming an open hole may have a peak power density of 1 megawatt/cm.$^2$ and a duration of 0.5 millisecond. The shape of the pulse may be as depicted in FIG. 9.

Figure 6:
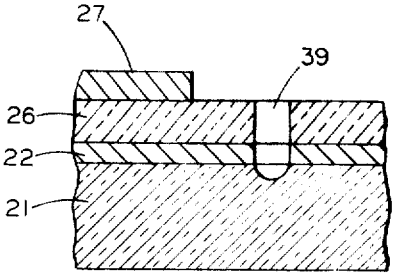
FIG. 6 is a similar view of the resistor after formation of a second type of open hole therein.

An open hole may be a multilayer hole, as the hole 38 of FIG. 5 or, as seen in FIG. 6, it may be a hole 39 formed in the film 22 at a point therein not covered by an overlying portion of the film 27. While the hole 39 is shown as passing through the nonconductive layer 26, it should be understood that the nonconductive layer need not overlie the film 22 at this point and, accordingly, in an embodiment where it does not, the hole 39 may be formed only in the film 22. As many open holes are formed in the resistor 20 as are necessary to increase the resistance thereof to the desired value. To this end, the holder 28 is made movable so as to enable selective locating of the additional hole(s).

If the initial resistance value of the resistor 20 is greater than the desired value, the laser assembly 31 is energized to apply a light pulse to the film 27 having, as seen in FIG. 9, a peak power density less than that of the open hole forming pulse, but having a longer duration. This pulse partially melts and partially evaporates the layers through which it passes, causing a molten flow of the film 22 and 27 to form a shunt hole 41 (FIG. 7), the inner wall of which is composed partially of one film and partially of the other, and physically and electrically connects the two films together. The intermediate, nonconductive layer 26 may or may not be completely evaporated. A portion of the substrate 21 may also be evaporated or melted, as seen in FIG. 7. Typically, a pulse for forming a shunt hole may have a peak power density of 750 kilowatts/cm.$^2$ and a duration of 2.3 milliseconds. As was the case for open holes, the diameter of a shunt hole is essentially the same as the beam width of the forming pulse which, in this instance, may be 6 mils.

It should be noted that depending on the materials of the several layers, and the power density and duration of the forming pulse, a shunt hole 42 of the type shown in FIG. 8 may be formed. The hole 42 is formed by a partial melting and evaporation of the film 27 and the layer 26 with no, or very little, melting and evaporation of the film 22.

The effect of a shunt hole can best be understood by referring to FIG. 10, which is an electrical schematic of a resistor 20 having a shunt hole therein. The shunt hole is represented as a shunt resistor 41, which typically may have a value of 100 ohms. As should be readily apparent, the location of the resistor 41 (i.e., the shunt hole represented thereby) determines how much of an effect the resistor 41 has. Thus, it has its greatest effect in reducing the resistance between the contacts 23 and 24 when it is located between the free end of the film 27 and the end of the film 22 adjacent to the contact 24. The effect of the resistor 41 lessens as its location moves toward the contact 23, and is negligible at a location immediately adjacent to the contact 23.

The location of an open hole, on the other hand, has little bearing on the resistance increase introduced thereby, with one exception. It has been found that where more than one open hole is formed in the resistor 20, the effect caused by a plurality of holes aligned along a line parallel to the direction of current flow (i.e., along the length of the resistor) is slightly less than that caused by the same number of holes aligned along a line transverse to the direction of current flow (i.e., along the width of the resistor).

In adjusting a resistor 20, "overshooting" of the desired value, in the case of an initially low value resistor, or "undershooting," in the case of an initially high value resistor, may occur. In such an event, a resistance change in the opposite direction may be easily effected by forming an opposite type hole, or holes, in the resistor 20.

ALTERNATIVE EMBODIMENTS

In FIG. 11 a resistor 20a is shown having a thin film 27a which is not connected either to the contact 23a or the contact 24a. Accordingly, to decrease the resistance of the resistor 20a, at least two shunt holes must be formed therein. Resistance increases are effected in the same manner employed for the resistor 20.

In FIG. 12, a resistor 20b is shown having a thin film 27b connected to both the contact 23b and the contact 24b. The resistance of the resistor 20b may be increased either by forming an open hole solely in the film 27b, solely in the film 22b or a multilayer open hole of the type shown in FIG. 5. As was the case for the resistor 20, resistances decreases of the resistor 20b are accomplished by forming one or more shunt holes therein. It should be noted that since the resistor 20b, physically, as well as electrically, is symmetrical about the center thereof, a shunt hole formed on one side of the center will have the same effect as one formed on the other side of the center, at the same distance therefrom.

It is to be understood that the above-described arrangements are simply illustrative of the principles of the invention. Thus, as noted above, the substrate 21, the thin films 22 and 27 and the nonconductive layer 26 may be composed of any suitable materials and may be assembled together by any suitable method of manufacture. Similarly, the dimensions and the geometry of the several layers may assume many different forms. Further, while the invention has been described in connection with a single resistor, it is not so limited and may be used in connection with networks composed of resistors or resistors and capacitors. It should also be understood that, while the hole forming pulses have been described as being light pulses generated by laser action, other high energy beams, such as electron beams, ionic beams and infrared beams, may be used to advantage.

*While the formation of shunt holes has been described with respect to utility in adjusting electrical characteristics it is to be understood that the shunt hole formation technique is useful in the interconnection of any two overlapped conductive members separated by a nonconductive layer.*

Various other arrangements may be devised by those skilled in the art which will embody the principles of the invention and fall within the spirit and scope thereof.

What is claimed is:

1. The bilateral method of adjusting an electrical characteristic of an electrical component to a desired value, the component including a first layer of conductive material, a layer of nonconductive material over at least a portion of the first conductive layer and a second layer of conductive material over at least a portion of the nonconductive layer, wherein a value of the component characteristic is measured and at least one open hole is formed in the component when the measured value of the characteristic deviates from the desired value thereof in a first direction, the improvement which comprises:

forming at least one shunt hole in the component when the measured value of the characteristic deviates from the desired value thereof in the opposite direction.

2. The method of claim 1, wherein:

the open hole is formed by applying an energy pulse to the first layer, having a power density and duration such as to vaporize the material of the first layer at the desired hole location; and the shunt hole is formed by applying an energy pulse to the component having a power density and duration such as to melt at least one of the conductive layers at the desired hole location and to form a hole through the nonconductive layer so that the molten material of the melted layer flows through the hole and contacts and adheres to the other conductive layer, thereby establishing an electrical connection between the conductive layers.

3. The method of claim 2, wherein the energy pulses for formation of the holes are pulses of monochromatic, coherent light generated by a laser.

4. The method of adjusting the resistance of a thin film resistor including an insulative substrate, a first thin film of conductive material over at least a portion of the substrate, a layer of nonconductive material over at least a portion of the first thin film, a second thin film of conductive material over at least a portion of the nonconductive layer, and first and second conductive contacts connected to the first thin film at spaced points thereof, wherein the resistance value between the first and second contacts is measured and at least one open hole is formed in the resistor when the measured value of resistance between the first and second contacts is less than a desired value, the improvement which comprises:

forming at least one shunt hole in the resistor when the measured resistance value between the first and second contacts is greater than the desired value.

5. The method as recited in claim 4, wherein the first thin film is of tantalum, the nonconductive layer is of tantalum pentoxide, and the second thin film is of "Nichrome."

6. The method of manufacturing a thin film component, wherein an electrical parameter thereof is measured and adjusted by forming at least one open hole in the component when the measured value of the parameter deviates in a first direction from a desired value, the improvement which comprises:

(a) depositing a first thin film of conductive material over at least a portion of an insulative substrate;

(b) forming a layer of nonconductive material over at least a portion of the first thin film;

(c) depositing a second thin film of conductive material over at least a portion of the nonconductive layer;

(d) attaching first and second conductive contacts to the first thin film at spaced points thereof;

(e) connecting the first and second contacts to a measuring instrument to measure the value of an electrical parameter of the component; and (f) forming at least one shunt hole in the component when the measured value of the parameter deviates in a direction opposite to the first from the desired value thereof.

7. The method of decreasing the resistance of a thin film resistor including two overlapping films of conductive material on opposite sides of a nonconductive layer, which comprises:

exposing one surface of the resistor in the region where the conductive films overlap, at least onec, to a beam of energy of sufficient power density and duration to melt a portion of one conductive layer and to vaporize a portion of the nonconductive layer to form at least one shunt hole in the resistor connecting the resistive films electrically at the point of exposure to the beam, to connect a portion of one film electrically in parallel with the other.

8. The method of decreasing the resistance of a thin film resistor including two overlapping films of conductive material on opposite sides of a nonconductive layer, and spaced contacts connected to a first one of the films to serve as terminals for the resistor, the second film not being initially connected electrically to the first, which method comprises:

exposing one surface of the resistor in the region where the conductive films overlap, at least twice at two spaced points, to a beam of energy of sufficient power density and duration to melt portions of one conductive layer and to vaporize portions of the nonconductive layer to form at least two spaced shunt holes in the resistor connecting the resistive films electrically at the points of exposure to the beams, to connect the portion of the second film between the shunt holes electrically in parallel with the first film so as to decrease the resistance between the contacts by an amount depending on the number and spacing of the shunt holes.

9. The method of decreasing the resistance of a thin film resistor including two overlapping films of conductive material on opposite sides of a nonconductive layer, and spaced contacts connected to a first one of the films to serve as terminals for the resistor, the second film being connected at one end to one of the contacts, which method comprises:

exposing one surface of the resistor in the region where the conductive films overlap, at least once, to a beam of energy of sufficient power density and duration to melt a portion of one conductive layer to form at least one shunt hole in the resistor connecting the resistive films electrically at the point of exposure to the beam, to connect a portion of the second film in parallel with the first film so as to decrease the resistance between the contacts by an amount depending on the number and spacing of the shunt holes and the spacing between shunt holes and the point of connection of the second film with one of the contacts.

10. In the art of adjusting the resistance value of a thin film resistor having an insulating overlay on which is applied a second thin metallic film, wherein the resistance is increased by applying laser beam of sufficient energy above a predetermined energy level to cut a hole through the thin film resistor to reduce its effective cross-sectional area, the improvement which comprises:

applying a laser beam of an energy level below said predetermined level through said second film, said insulating overlay and said thin film resistor, to cut a hole through said second film and said insulating overlay while liquefying the metal of the second thin film and depositing said liquefied metal on the wall of the cut hole to form a shunting electrical path extending from the second film through the deposited metal on the wall of the hole to the thin film resistor.

References Cited

The following references, cited by the Examiner, are of record in the patented file of this patent or the original patent.

UNITED STATES PATENTS

| | | | |
|---|---|---|---|
| 2,710,325 | 6/1955 | Johnson | 219—69 |
| 3,071,749 | 1/1963 | Starr | 338—314 |
| 3,119,919 | 1/1964 | Pratt | 219—384 |
| 3,140,379 | 7/1964 | Schleich et al. | 219—69 |
| 3,261,082 | 7/1966 | Maissel et al. | 29—620 |
| 3,330,696 | 7/1967 | Ullery et al. | 117—212 |

OTHER REFERENCES

Laser Beam Trims Resistors, Electronics, Feb. 21, 1964, pp. 46–47.

CHARLES W. LANHAM, Primary Examiner

V. A. DI PALMA, Assistant Examiner

U.S. Cl. X.R.

29—625, 628; 219—121 L; 338—308